United States Patent [19]
Bachman et al.

[11] Patent Number: 5,611,886
[45] Date of Patent: Mar. 18, 1997

[54] PROCESS CHAMBER FOR SEMICONDUCTOR SUBSTRATES

[75] Inventors: Stephen A. Bachman, N. Attleboro, Mass.; Gary B. Tepolt, Pelham, N.H.

[73] Assignee: Integrated Solutions, Inc., Tewksbury, Mass.

[21] Appl. No.: 531,195

[22] Filed: Sep. 19, 1995

[51] Int. Cl.[6] ........................ B44C 1/22; H01L 21/00
[52] U.S. Cl. ................. 156/345; 156/345; 156/639.1
[58] Field of Search ..................... 156/345, 345 L, 156/637.1, 639.1; 118/50, 52, 54, 64, 320

[56] References Cited

U.S. PATENT DOCUMENTS

| | | | |
|---|---|---|---|
| 4,822,450 | 4/1989 | Davis et al. | 156/643 |
| 4,838,979 | 6/1989 | Nishida et al. | 156/345 L |
| 4,875,989 | 10/1989 | Davis et al. | 204/298 |
| 4,911,103 | 3/1990 | Davis et al. | 118/725 |
| 4,949,671 | 8/1990 | Davis et al. | 118/725 |
| 5,138,973 | 8/1992 | Davis et al. | 118/723 |

*Primary Examiner*—William Powell
*Attorney, Agent, or Firm*—Weingarten, Schurgin, Gagnebin & Hayes LLP

[57] ABSTRACT

A process chamber configurable for the execution of discrete subprocesses in a substrate coating process such as photolithography. Two vertically staggered rings disposed within the process chamber channel a flow of gas through the chamber and retain fluent chemical within the process environment. A replaceable liner further enables reconfiguration of the chamber. The chamber is used for low-velocity dispensing of fluent process chemical onto the substrate surface with a laminar exhaust gas flow through ventilation passages formed about the rings. The chamber is also used during high-velocity spinning of the substrate for even process chemical distribution in a solvent saturated atmosphere. The ventilation passages enable high exhaust flow through the chamber while minimizing the direct impingement of exhaust air on the substrate.

22 Claims, 14 Drawing Sheets

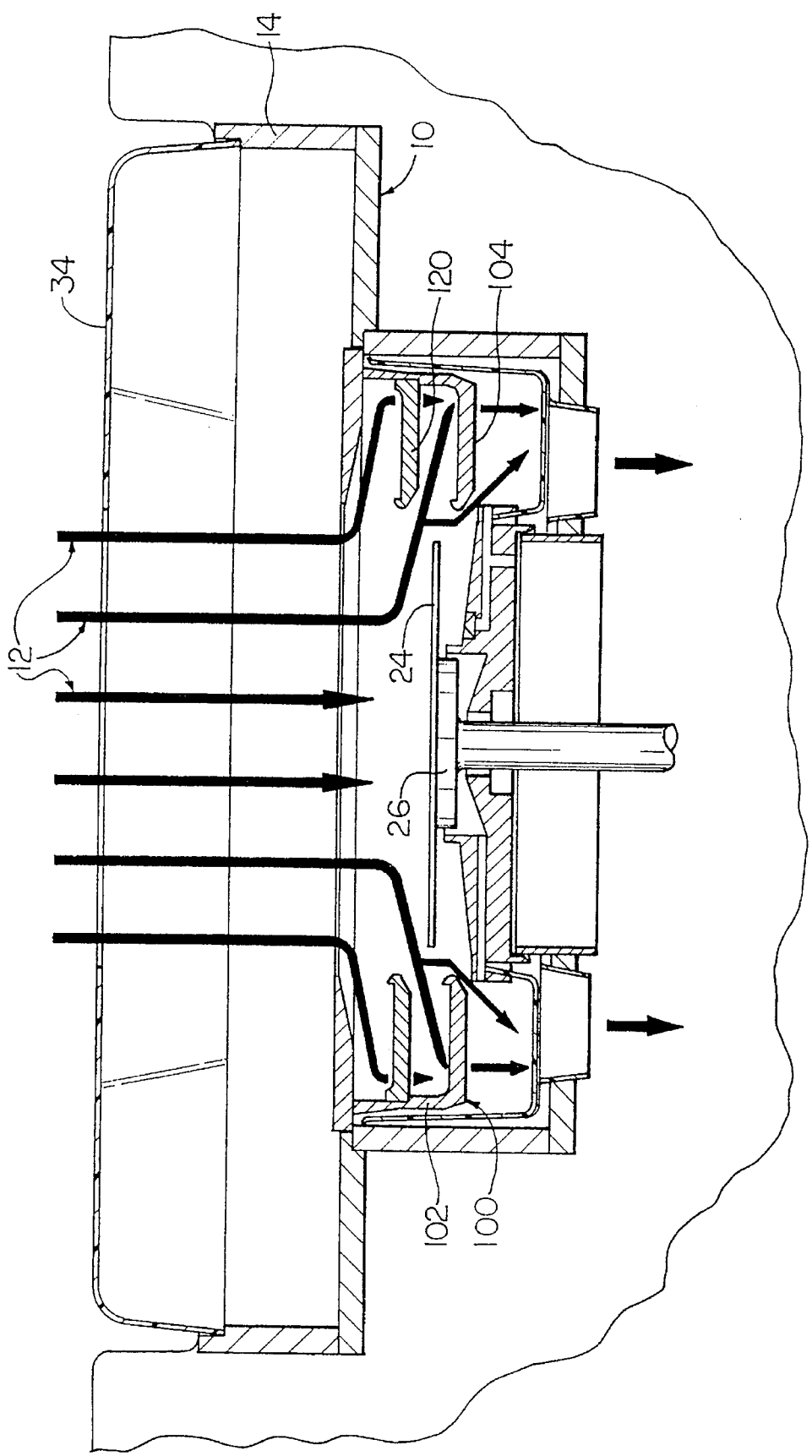
FIG. IB

PROCESS CHAMBER FOR SEMICONDUCTOR SUBSTRATES

FIELD OF THE INVENTION

This invention relates to processing equipment for photolithography, and in particular to a dual-ring process chamber for the application of photoresist and other fluent process chemicals onto semiconductor or other analogous substrates.

BACKGROUND OF THE INVENTION

The application of fluent process chemicals, such as photoresist used in semiconductor substrate photolithography, typically requires at least two chamber conditions. Under the first chamber condition, fluent process chemical is deposited onto the substrate. This is preferably executed with a minimum distance separating a dispense tip, typically extending over the substrate within the process chamber, and the target substrate. If a significant distance exists between the tip and the substrate, the applied process chemical may splash, resulting in an uneven application.

A second chamber condition is required for the even distribution of applied chemical across the substrate, such as for a planarization stage in a photolithography coat process. Traditionally, the substrate is spun at high speeds and high exhaust flows to accomplish this. However, it is advantageous to provide a concentrated solvent vapor environment to promote this even distribution. In the past, such concentrated vapor environments have posed risks to personnel in the vicinity of the process chamber since an exhaust flow necessary to avoid pollution of an operator workspace typically decreases solvent concentration while creating vortices above the spinning substrate. Such vortices typically result in the deposition of contaminants on the substrate. Further, it has been difficult to provide an environment consistently saturated with solvent, particularly for the first substrates processed after a period of disuse, leading to a lack of uniformity in solvent concentration referred to as "green cup".

A develop subprocess further benefits from high exhaust flow to minimize atomized develop spray particles from escaping into the local process environment. However, as previously indicated, such a high exhaust flow in known systems results in undesirable vortices and flow patterns.

SUMMARY OF THE INVENTION

The present invention provides a process chamber configurable for the execution of discrete subprocesses in a semiconductor or analogous substrate coating process such as photolithography. Two vertically staggered rings are disposed within the process chamber with each functioning to channel a laminar, smooth and continuous flow of gas such as air through the chamber and to retain a pool of fluent chemical such as solvent within the process environment and proximate the substrate. A replaceable liner within the chamber further enables reconfiguration of the chamber for each step. The chamber is useful for such subprocesses as the application of photoresist, photoresist developer solution, spin-on-glass, polyamide, or other liquid processing chemicals onto a substrate such as a silicon wafer, or glass or ceramic substrates.

A first use of the chamber is for dispensing a fluent process chemical from a dispense tip to the substrate surface which is elevated within the chamber, thus requiring the chemical to travel only a short distance from tip to substrate. Laminar exhaust gas flow is directed down onto the substrate and off the substrate edge, through ventilation passages formed about the upper and lower rings.

A second use of the chamber is to promote an even distribution of process chemical across the substrate. A pool of solvent formed within the upper and lower rings before and during substrate processing increases the solvent level or vapor concentration in the boundary layer of air directly above the substrate. With the substrate disposed in a lower position within the chamber, relative to the rings, ventilation passages disposed about the upper and lower rings enable laminar, high-volume exhaust flow through the chamber while minimizing the direct impingement of exhaust air on the substrate, thus allowing uniform film formation and drying across the substrate. This further enables the provision of a solvent-laden processing environment while minimizing the potential risk of pollution outside the chamber.

A secondary advantage of the two solvent laden rings is that process chemicals which are spun off the substrate (approximately 98% of the photoresist is spun off the wafer) are diluted in the solvent pooled on the rings, thereby minimizing cup cleaning and maintenance.

BRIEF DESCRIPTION OF THE DRAWINGS

These and other features of the present invention are more fully set forth below in the exemplary detailed description and accompanying drawings of which:

FIG. 1B is a side sectional view of a substrate processing chamber according to the present invention configured for a develop subprocess or for a coat planarization step of a coat subprocess;

DETAILED DESCRIPTION

The present invention provides a process chamber which is configurable for either of two semiconductor or analogous substrate subprocesses. Specifically, in a photolithographic process, coating a substrate with a process chemical such as photoresist is enabled in a first hardware configuration, and developing an image by high-speed rotation of a substrate in a developer-laden environment is enabled in a second hardware configuration. The following description of the present invention will refer to these subprocesses as exemplary of the various subprocesses which are enabled by the presently disclosed chamber.

Figure 1A:
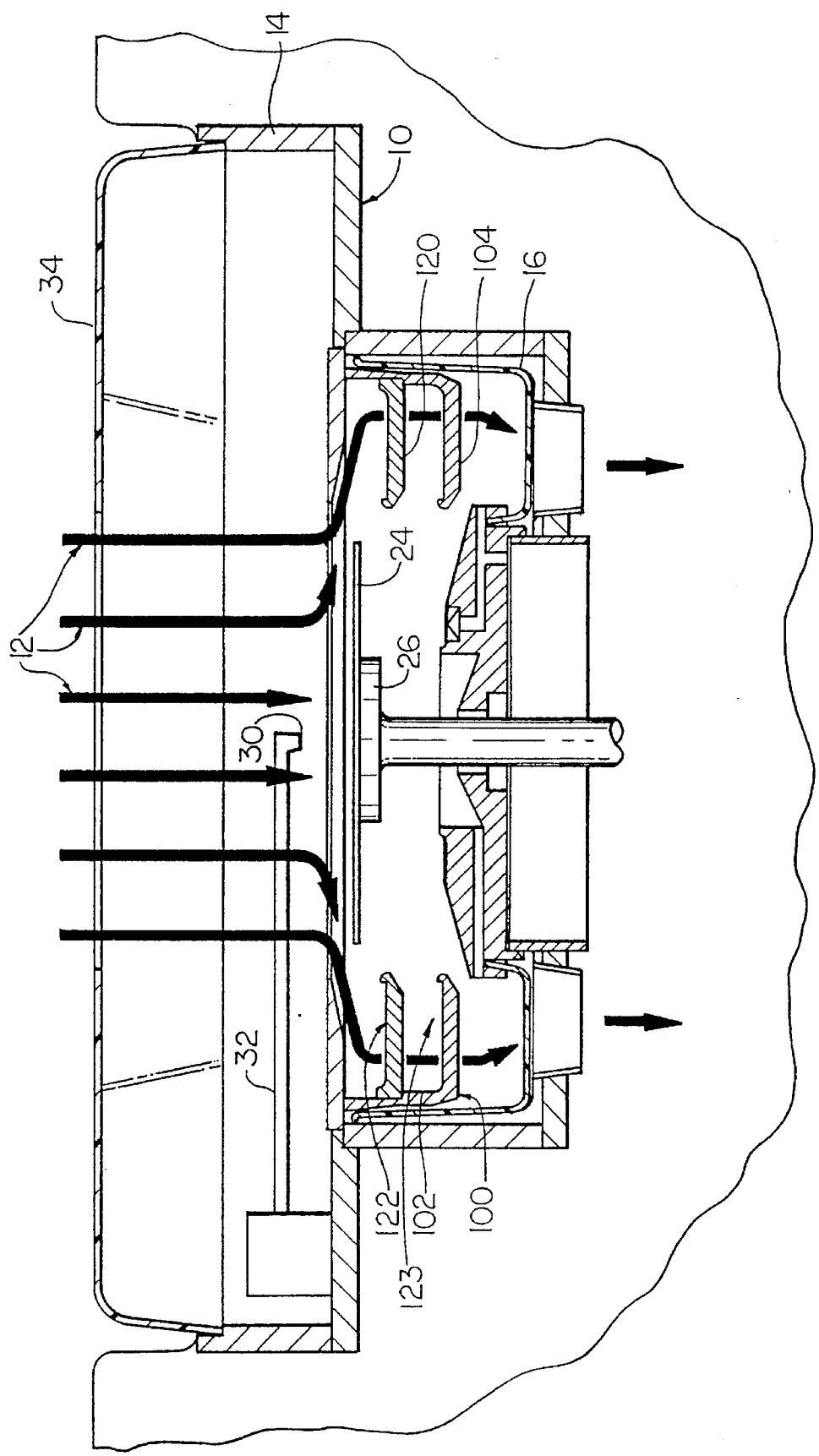
FIG. 1A is a side sectional view of a substrate processing chamber according to the present invention configured for a dispense step of a coat subprocess.

The depiction of the process chamber 10 of the present invention in FIG. 1A illustrates various component parts of the chamber 10 configured for a coat subprocess, in addition to the flow of exhaust air 12 through the chamber 10. Briefly stated, the process chamber 10 includes a chamber housing 14 which defines an interior workspace or cavity, a replaceable liner 16 within the cavity, and a ring assembly 100 disposed about the periphery of the liner 16. The ring assembly 100 further includes a lower ring 104 and an upper ring 120 disposed on a ring support structure 102.

As shown in FIG. 1A, a workpiece 24 such as a substrate or silicon wafer is elevated on a substrate chuck 26 within the cavity to a position above the upper ring 120. A dispense tip 30, extending from a pivoting arm 32, is thus quite close to the substrate (typically 0.2 to 0.5 inches separate the tip 30 from the substrate 24 during the dispensing of photoresist). This provides a low-impact application of process chemical such as photoresist onto the substrate. Laminar exhaust air flow 12 is provided through an orifice in a cover 34 over the cavity, thus reducing the opportunity for process chemicals to pollute the environment outside the chamber 10. Also, wells 122, 123 in the upper ring 120 and lower ring 104 retain solvent to promote the creation of an atmosphere laden with solvent.

A solvent-rich atmosphere is desirable since typical process chemicals used in coating processes are highly viscous. This atmosphere thus promotes proper distribution of process chemical across the substrate, resulting in an even application thickness and greater uniformity or planarization of process chemical. Without the solvent pools to thin excess process chemical and promote its evacuation, excess flung off the substrate will otherwise congeal and clog chamber drain(s). Further, this excess will dry out, become brittle, and act as a particulate contaminant. Periodic refreshing of the solvent pool is provided herein by at least one rinse tube (not shown in FIG. 1A).

FIG. 1B provides essentially the same view of the chamber 10, though configured for a coating spin-off process or, when configured with develop hardware, a develop subprocess. In this situation, the substrate 24 is positioned on the chuck 26 at a second work position above the lower ring 104 and below the upper ring 120. The chuck 26 is connected to a motor (not illustrated) beneath the chamber 10 for spinning the substrate 24 rapidly to promote an even distribution of process chemical across the substrate 24 and to promote uniform drying of the chemical. Once again, a laminar exhaust air flow 12 is provided through the cover 34, though the majority of this flow 12 is directed through ventilation passages (to be discussed subsequently) between the ring support structure 102 and the lower and upper rings 104, 120. Therefore, exhaust air flow is provided without allowing a significant air column to impinge directly onto the substrate. This avoids the deposition of particulates onto the substrate, as well as the formation of vortices over the substrate which tend to temporarily suspend such particulates before depositing them on the substrate. The solvent pools formed on the lower and upper rings again promote an even distribution of applied chemicals by providing a solvent-rich environment in which such chemicals are spun across the substrate. In a typical embodiment of the present application, de-ionized water is used as the solvent in a develop subprocess to avoid the crystallization of sodium hydroxide, used to remove (develop) photoresist.

Figure 2A:
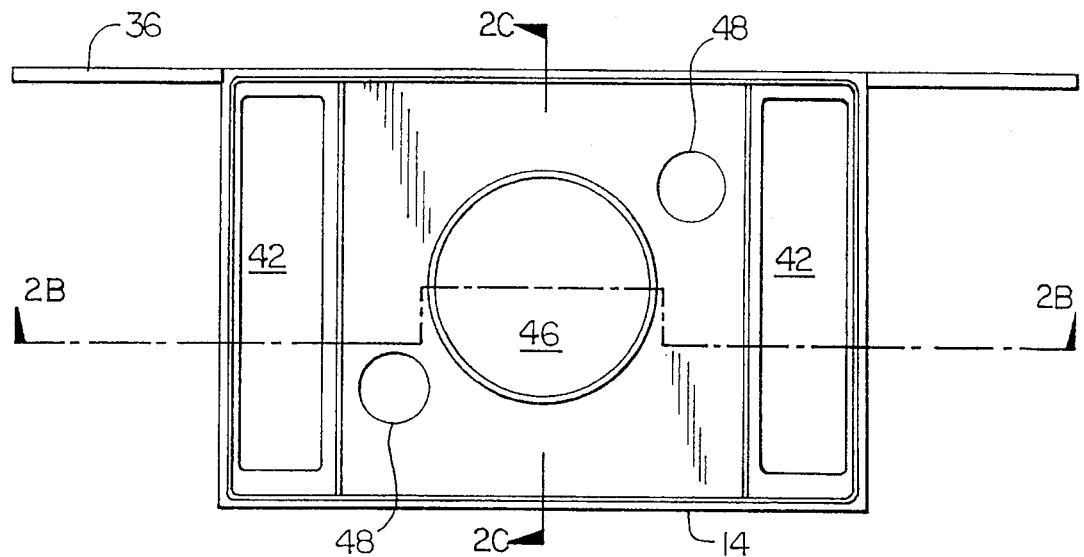
FIG. 2A is a top plan view of a chamber housing employed in the processing chambers of FIGS. 1A and 1B.
Figure 2B:
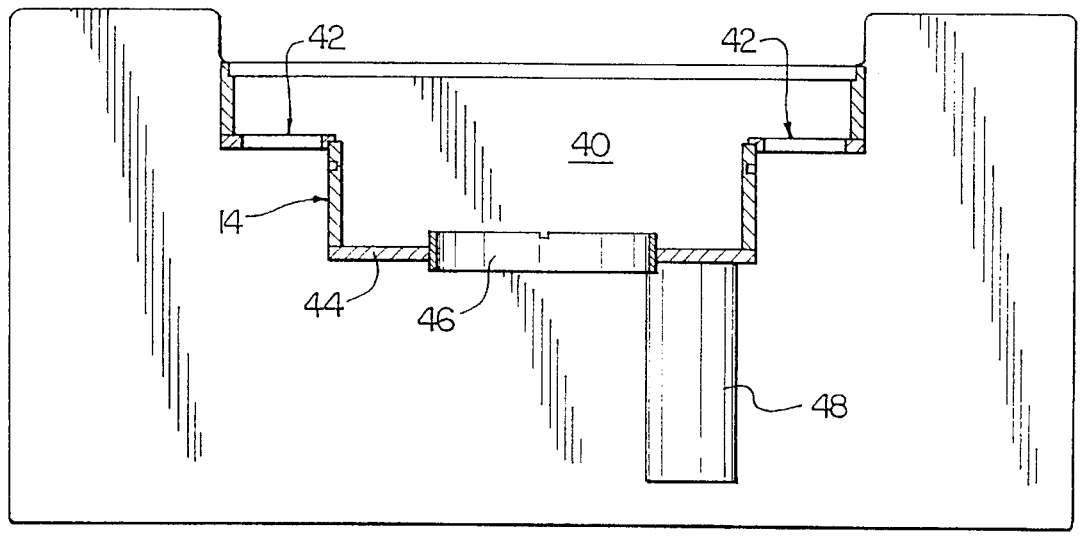
FIG. 2B is a side sectional view of the chamber housing of FIG. 2A taken along lines 2B—2B.
Figure 2C:
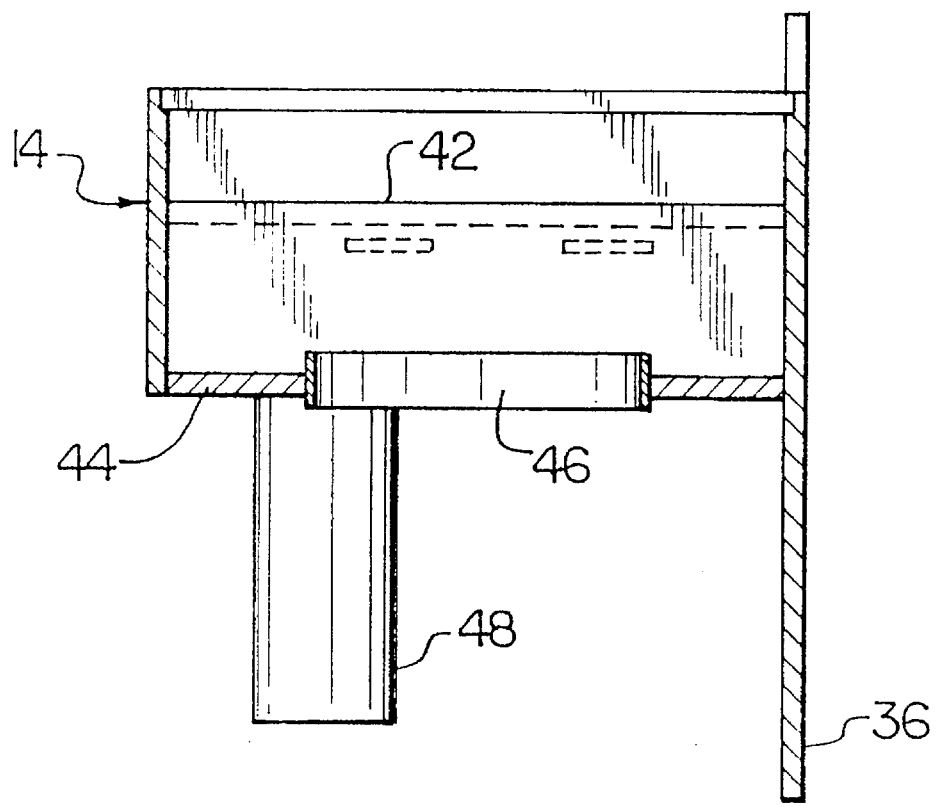
FIG. 2C is an end sectional view of the chamber housing of FIG. 2A taken along lines 2C—2C.

In FIGS. 2A through 2C, the chamber housing 14 is illustrated. In a first embodiment, the housing 14 itself is formed of polypropylene, as is a mounting plate 36 extending from one side of the housing 14. In the cross-sectional view of FIG. 2B, it is seen that the housing 14 defines a cavity 40 in which substrate processing occurs. Above this cavity 40, the housing 14 widens to form shelves 42 suitable for retaining process chemical dispensing equipment, as shown in FIGS. 1A and 1B.

In a bottom surface 44 of the housing 14, an orifice 46 is formed which enables access to process chemicals from beneath the chamber 10 and to a motor (not illustrated) which is positioned directly beneath the orifice 46. This motor enables the rapid rotation of the substrate during the develop subprocess referred to above.

Also formed in the bottom surface 44 of the housing 14 are two housing drains 48 which enable the rapid exhaust of the laminar air flow 12 directed through the chamber 10, as well as the evacuation of excess process chemicals. In further embodiments of the present invention, a number of drains 48 other than two are employed. For instance, one drain 48 is positioned in each corner of the housing bottom surface 44 in one such embodiment. The drain diameter is specified according to the number of drains employed and the rate of air or other gas to be evacuated.

Figure 3A:
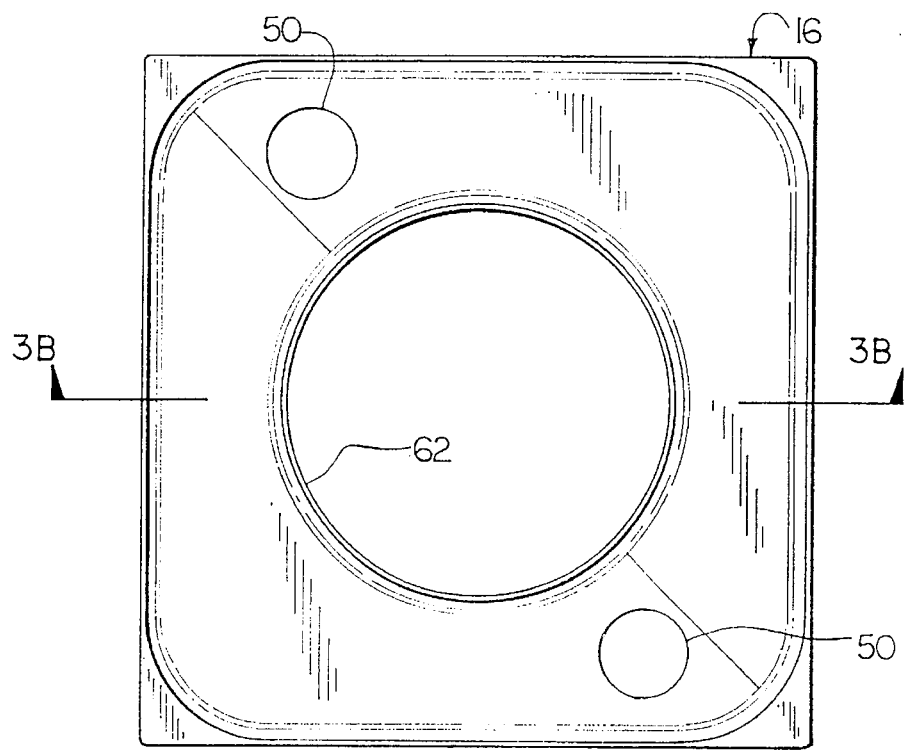
FIG. 3A is a top plan view of a liner employed in the processing chambers of FIGS. 1A and 1B.
Figure 3B:
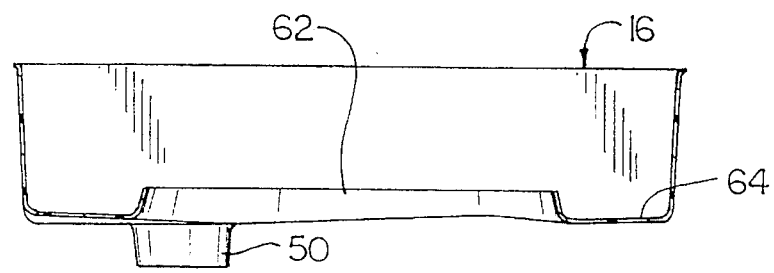
FIG. 3B is a side view of a coat or develop subprocess liner taken along lines 3B—3B in FIG. 3A.

A replaceable liner 16 is illustrated in FIGS. 3A and 3B. The liner 16 material is preferably 0.06 inch thick white polyethylene, though other materials resistant to solvent destruction are also suitable.

Two liner drains 50 are also shown in FIGS. 3A–3B which are in registration with the housing drains 48 shown in FIG. 2A. Thus, the use of the liner 16 does not interfere with the free exhaust of air and evacuation of excess process chemicals. As with the housing 14, the liner 16 can be provided with a number of drains other than two, depending upon the application.

Since one of the goals of the present invention is to enable process chemical coating with a minimized distance between a dispense tip 30 and a substrate 24, it is necessary to raise the substrate 24 within the chamber 10 without allowing process chemicals and exhaust air to exit the chamber 10 via the housing bottom surface orifice 46. A significant distance between develop tip and substrate typically results in a high impact application of chemical on the substrate which poses the risk of damaging existing structures on the substrate. Once in place within the housing cavity 40, an inner flange 62 is centered with respect to the orifice 46 in the housing bottom surface 44 through which access to a supply of process chemicals and a motor is gained. The housing bottom orifice 44 is effectively sealed off when a coat hub 70, described subsequently, is in place over the flange 62.

In a develop subprocess and similar subprocesses which rely on rapid rotation of a substrate for even distribution of a chemical disposed thereon, the present invention provides a lower work position, below the lower ring 104. Here, other chemicals such as de-ionized water pooled on the rings 104, 120 (to be described subsequently) provides a location for dilution of developer ejected off the spinning substrate, while significant exhaust flows 12 continue about the periphery of the chamber 10. Because of the higher surface tension of developer chemicals, a low inner flange 62 is required to block access to the bottom surface orifice 46.

A floor 64 of the liner 16 is canted in a first embodiment such that fluent process chemicals which fall onto the liner floor 64 move toward one of the liner drains 50. The actual cant of the floor 64 will depend on the number and location of liner drains 50 as well as the type of process chemicals to be employed.

Figure 4A:
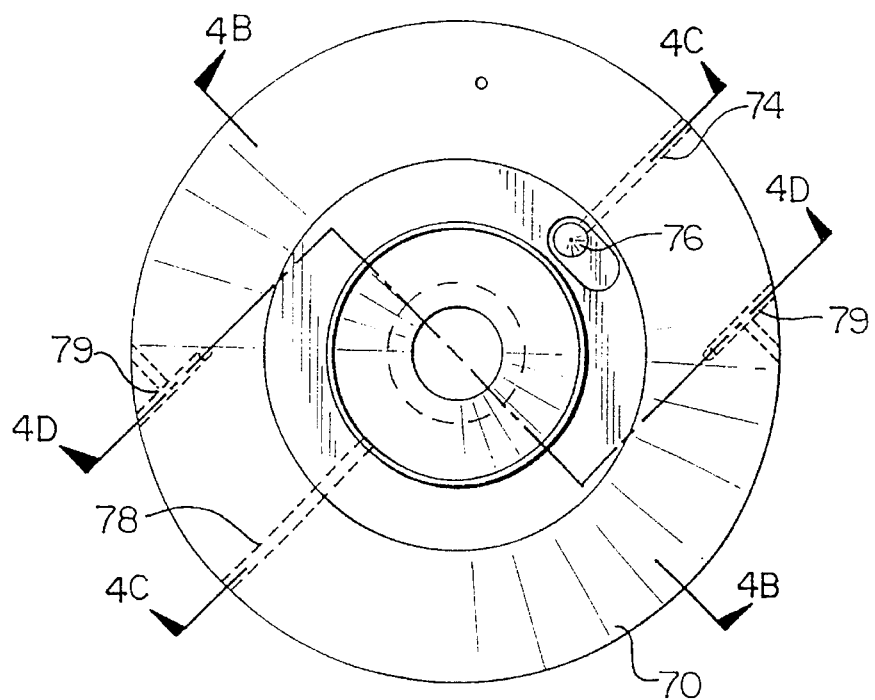
FIG. 4A is a top plan view of a coat subprocess hub employed in the processing chamber of FIG. 1A.
Figure 4B:
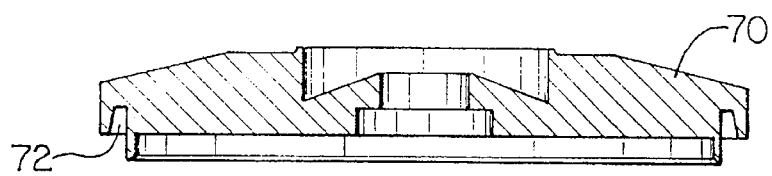
FIG. 4B is a side section view of the coat subprocess hub of FIG. 4A taken along lines 4B—4B.
Figure 4C:
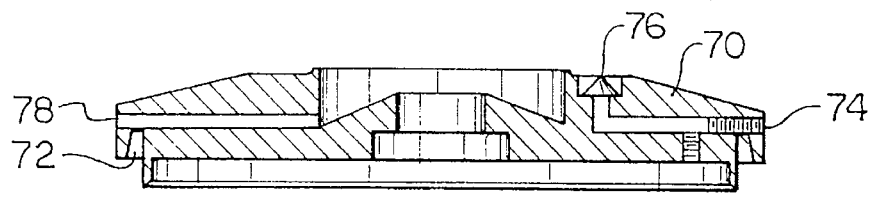
FIG. 4C is a side section view of the coat subprocess hub of FIG. 4A taken along lines 4C—4C.
Figure 4D:
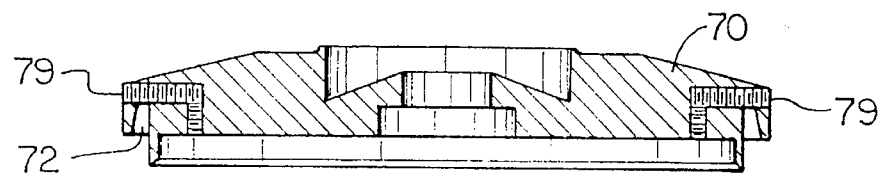
FIG. 4D is a compound side section view of the coat subprocess hub of FIG. 4A taken along lines 4D—4D.
Figure 5A:
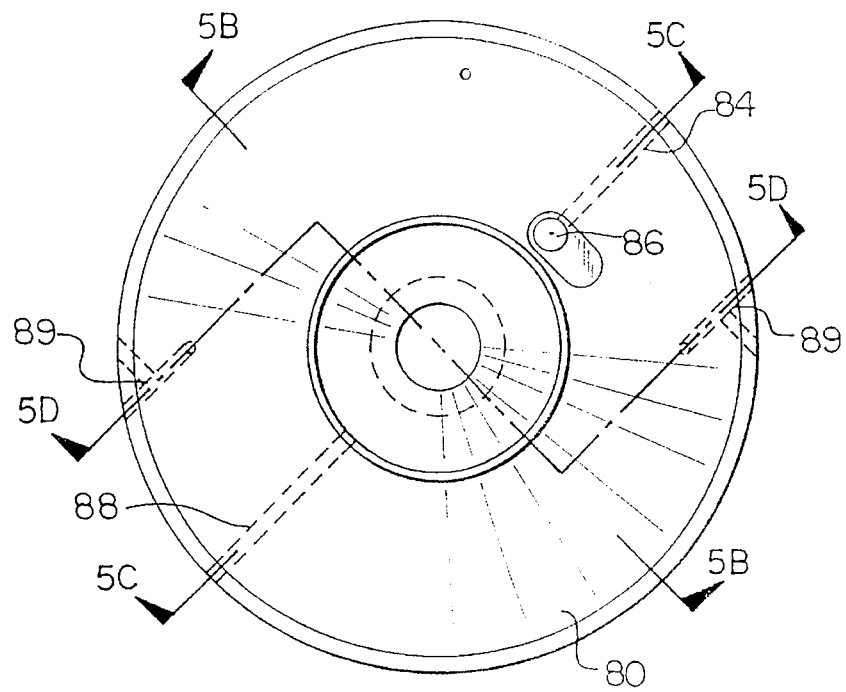
FIG. 5A is a top plan view of a develop subprocess hub employed in the processing chamber of FIG. 1B.
Figure 5B:
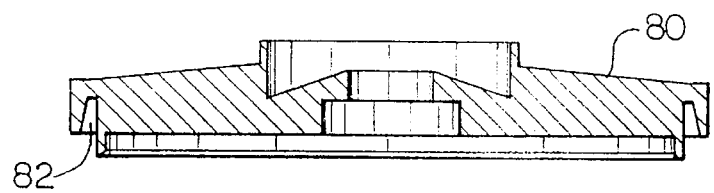
FIG. 5B is a side section view of the develop subprocess hub of FIG. 5A taken along lines 5B—5B.
Figure 5C:
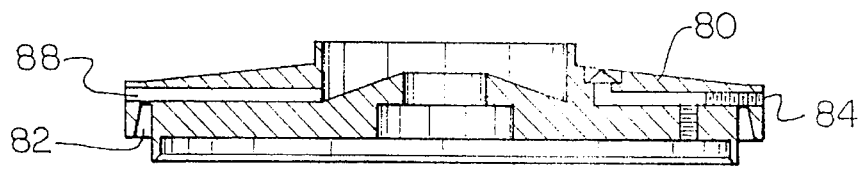
FIG. 5C is a side section view of the develop subprocess hub of FIG. 5A taken along lines 5C—5C.
Figure 5D:
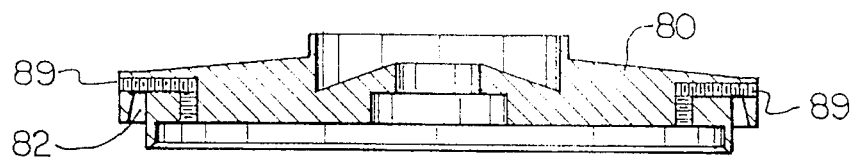
FIG. 5D is a compound side section view of the develop subprocess hub of FIG. 5A taken along lines 5D—5D.

In order to maintain the liner 16 in place within the housing cavity 40 during a coat subprocess, a coat hub 70 is disposed over the liner inner flange 62. This coat hub 70, shown in FIG. 4A, serves several purposes. First, it keeps the liner 16 in place against the housing bottom surface 44. The upper edge of the inner flange 62 is retained inside an annular groove 72 formed in the underside of the coat hub 70. Second, the cooperative engagement between hub 70 and liner 16 prevents exhaust air 12 and excess process chemical from exiting through the housing bottom surface orifice 46.

Third, the coat hub 70 provides conduits for transmission of process chemicals. One conduit 74 supplies a process chemical from a source beyond the housing orifice 46 to a backside rinse nozzle 76 disposed within the coat hub 70. As its name implies, this nozzle 76 provides a spray of process chemical onto the backside of a substrate 24 disposed above the coat hub 70 on a chuck 26.

Another conduit 78 evacuates process chemicals from within a depression on top of the coat hub 70 to avoid leakage of the chemical through the orifice 46. Yet another pair of conduits 79 provide process chemical from a source beyond the orifice 46 through rinse tubes (to be described subsequently) via fluid-tight connections and onto the lower and upper rings 104, 120.

Similar to the coat hub 70, a develop hub 80 provides the process chamber 10 with the same functions. Specifically, the develop hub 80 holds the liner 16 in place by retaining the liner inner flange 62 within an underside annular groove 82 formed in the develop hub 80. Second, the develop hub 80 aids in excluding exhaust air and process chemicals from the housing orifice 46. Third, the develop hub 80 provides a number of conduits for process chemicals. For instance, a first conduit 84 supplies process chemical to a backside rinse nozzle 86. A second conduit 88 evacuates chemicals from a depression formed in the top of the develop hub 80. A conduit pair 89 supplies process chemicals to the lower and upper rings 104, 120 through the rinse tubes (described below).

One difference between the coat hub 70 and the develop hub 80 lies in the angulation of the upper surface of each hub 70, 80 with respect to a horizontal plane. Specifically, in the develop hub 80, this surface inclines toward the periphery of the hub 80 at a very shallow angle, on the order of two degrees. This promotes the outward flow of process chemical and avoids pooling beneath the substrate. For instance, in a develop subprocess, water is used as a rinse agent, to moderate developer chemical activity, and as a solvent to avoid the crystallization of the sodium hydroxide developer. This water, however, has a tendency to pool on surfaces below the substrate 24. By providing a shallow inclination to the upper surface of the hub 80, there is relatively little clearance for water to accumulate below the substrate. In a coat subprocess, it is more desirable that this hub 70 upper surface be angled downward, thus promoting the downward progression of excess process chemical. Otherwise, such chemical would tend to be flung off the substrate 24 and onto the lower ring 104. Illustratively, the hubs 70, 80 are formed of materials resistant to solvent destruction.

Figure 6A:
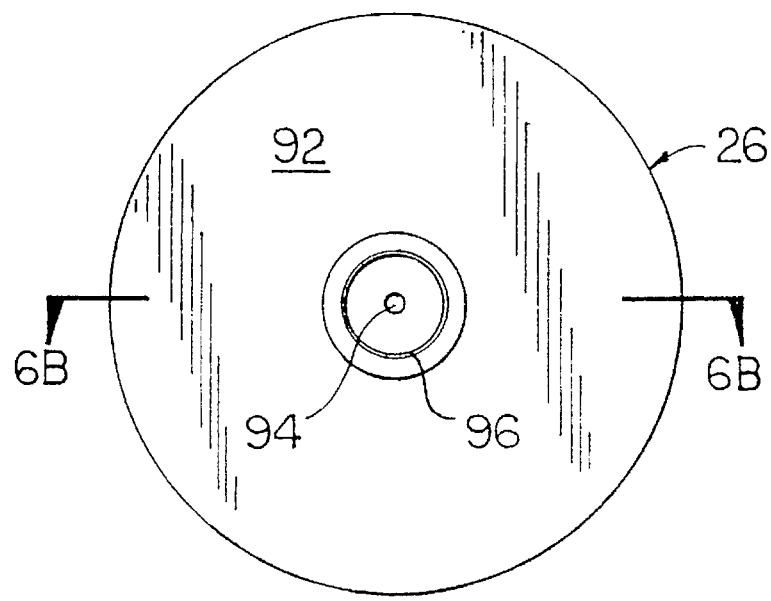
FIG. 6A is a bottom plan view of a substrate chuck employed in the processing chambers of FIGS. 1A and 1B.
Figure 6B:
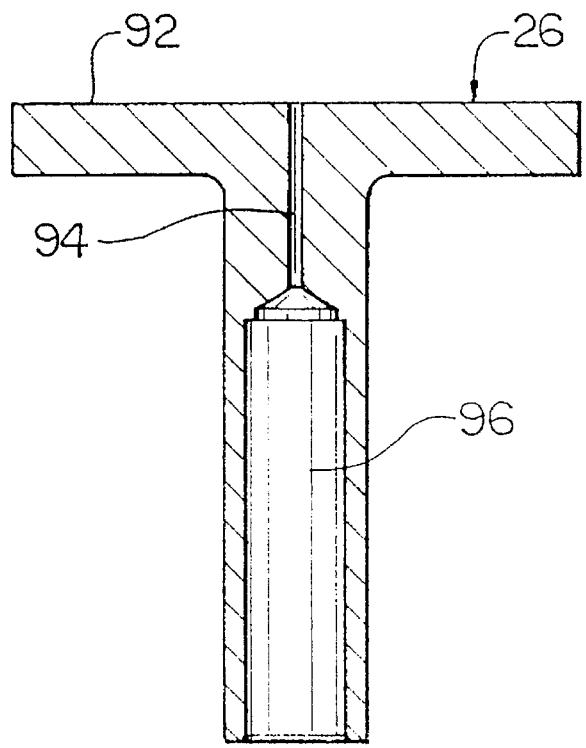
FIG. 6B is a side sectional view of the substrate chuck of FIG. 6A taken along lines 6B—6B.

Disposed through the depression formed in the upper surface of each of the coat and develop hubs 70, 80 is a substrate chuck 26, as illustrated in FIGS. 6A and 6B. This chuck 26, preferably formed of plastic (CELCON™, PEEK™, or TEFLON™), elevates the substrate 24 above the hub 70, 80 and enables rapid substrate 24 rotation, as needed for a coat planarization or develop subprocess. As best viewed in FIG. 6B, the chuck 26 is comprised of a platen 92 on which the substrate 24 rests. A narrow passage 94 extends through an upper portion of the chuck 26 from the platen 92 to a motor shaft bore 96. This bore 96 enables the attachment of the chuck 26 to a motor shaft for rotation of the substrate 24. By providing a vacuum through the motor shaft bore 96 and the narrow passage 94, the substrate 24 is retained on the platen 92. At least two embodiments of the chuck 26 are provided, one for the coat subprocess and the coat hub 70, and another for the develop subprocess and the develop hub 80.

Disposed within the liner 16 is a ring assembly 100, as illustrated in FIGS. 7A through 7F, formed of polypropylene or like material. Thus, the liner 16 is interposed between the ring assembly 100 and the chamber housing 14. The ring assembly 100 includes a ring support structure 102 providing a substantially vertical frame of a square vertical projection with rounded off corners. The outer dimensions of the support structure 102 enable a close fit within the liner 16 approximately halfway down the side of the liner 16.

Figure 7A:
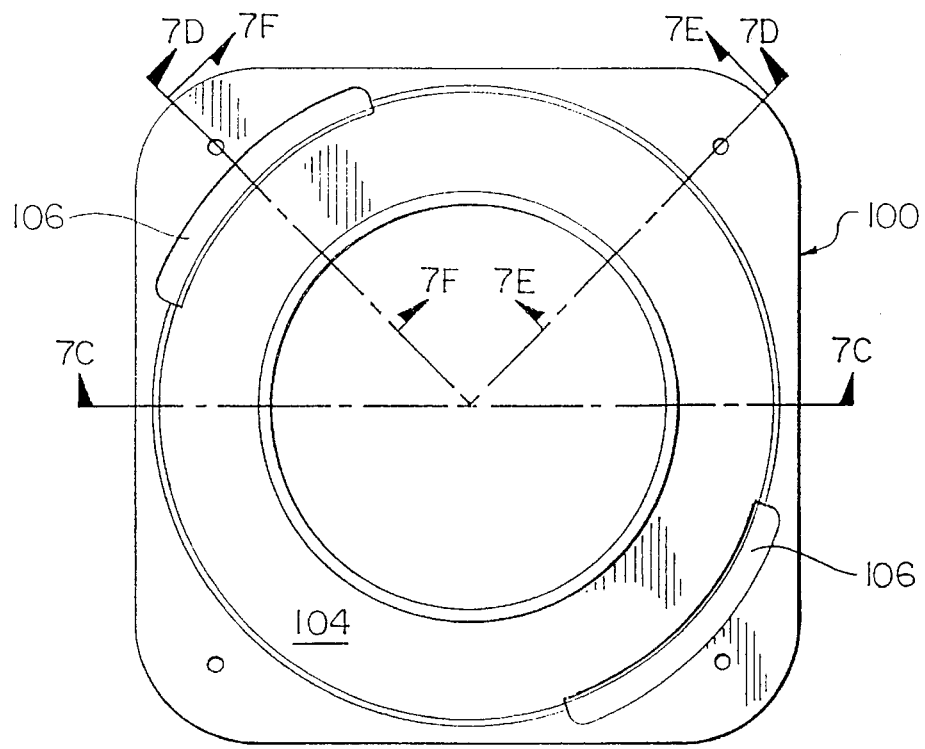
FIG. 7A is a top plan view of a lower deflector ring employed in the processing chambers of FIGS. 1A and 1B.
Figure 7B:
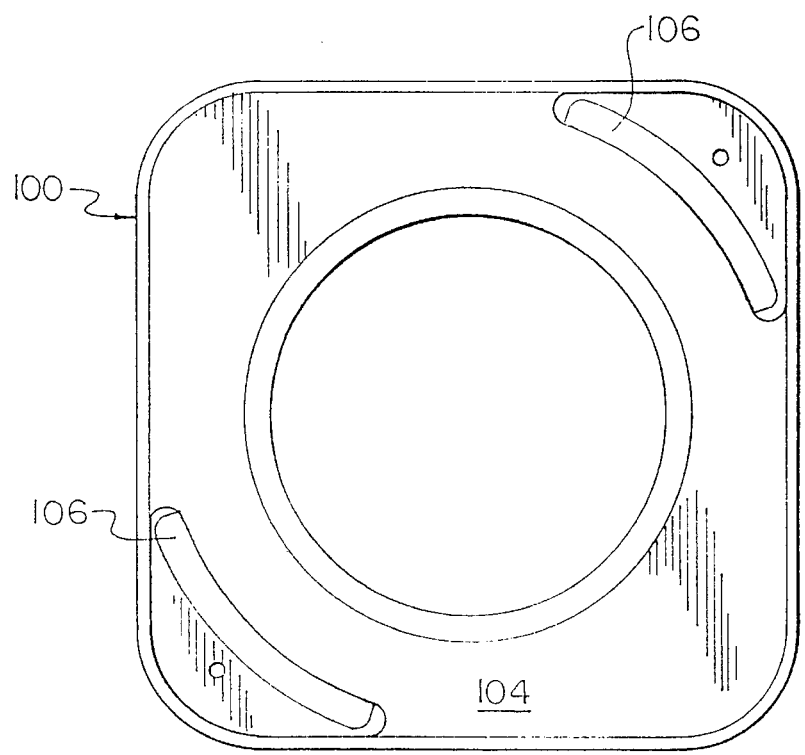
FIG. 7B is a bottom plan view of the lower deflector ring of FIG. 7A.
Figure 7C:
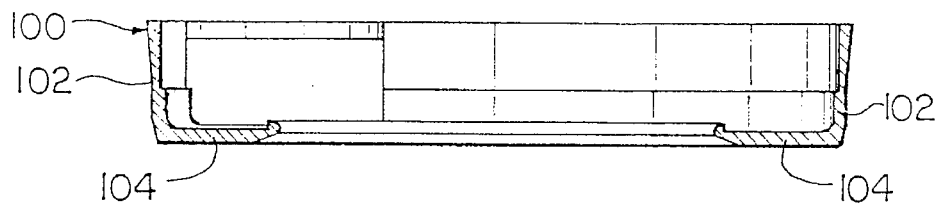
FIG. 7C is a side sectional view of the lower deflector ring of FIG. 7A taken along lines 7C—7C.
Figure 7D:
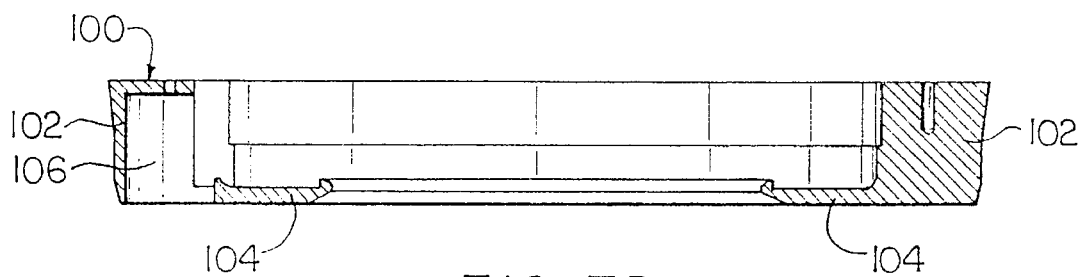
FIG. 7D is a compound side sectional view of the lower deflector ring of FIG. 7A taken along lines 7D—7D.
Figure 7E:
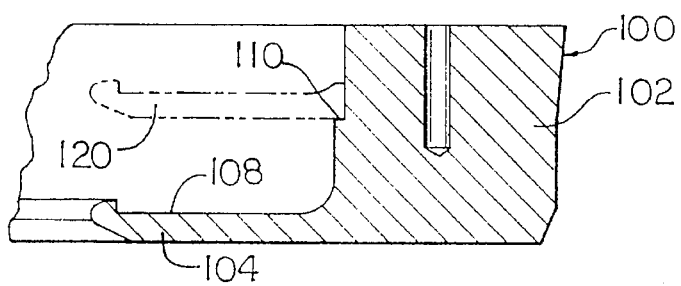
FIG. 7E is a detail of the lower deflector ring of FIG. 7D.
Figure 7F:
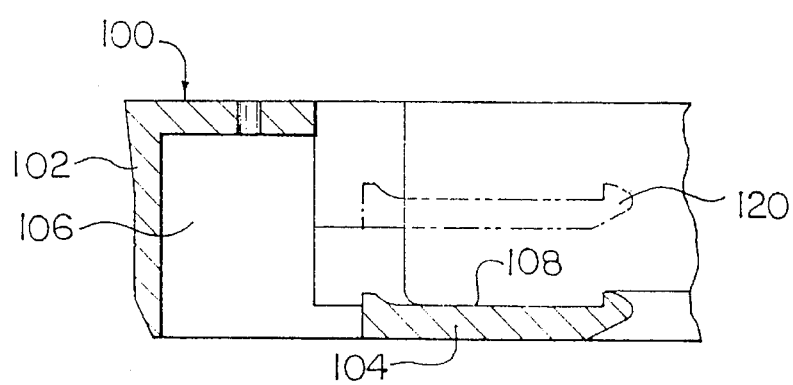
FIG. 7F is a detail of the lower deflector ring of FIG. 7D.
Figure 8A:
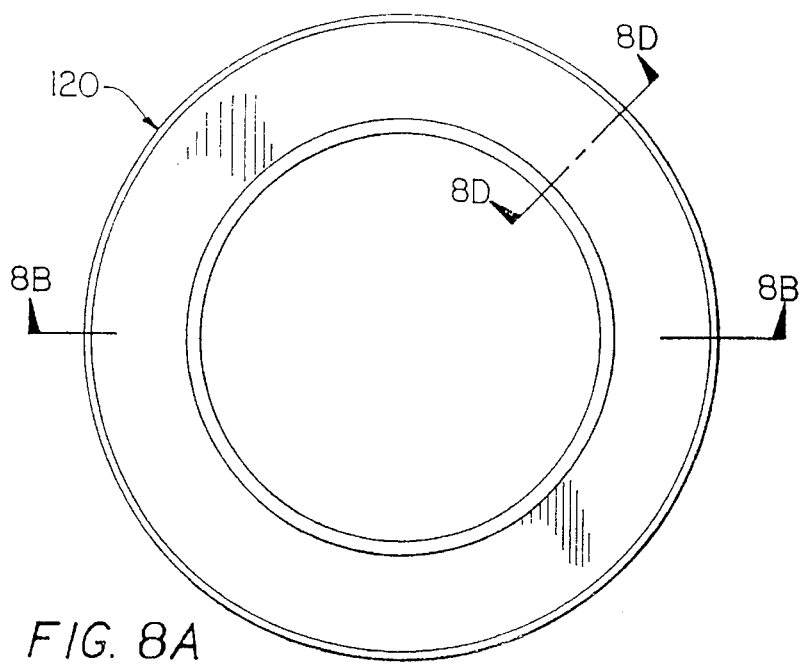
FIG. 8A is a top plan view of an upper deflector ring employed in the processing chambers of FIGS. 1A and 1B.
Figure 8B:
FIG. 8B is a side view of the upper deflector ring of FIG. 8A taken along lines 8B—8B.
Figure 8C:
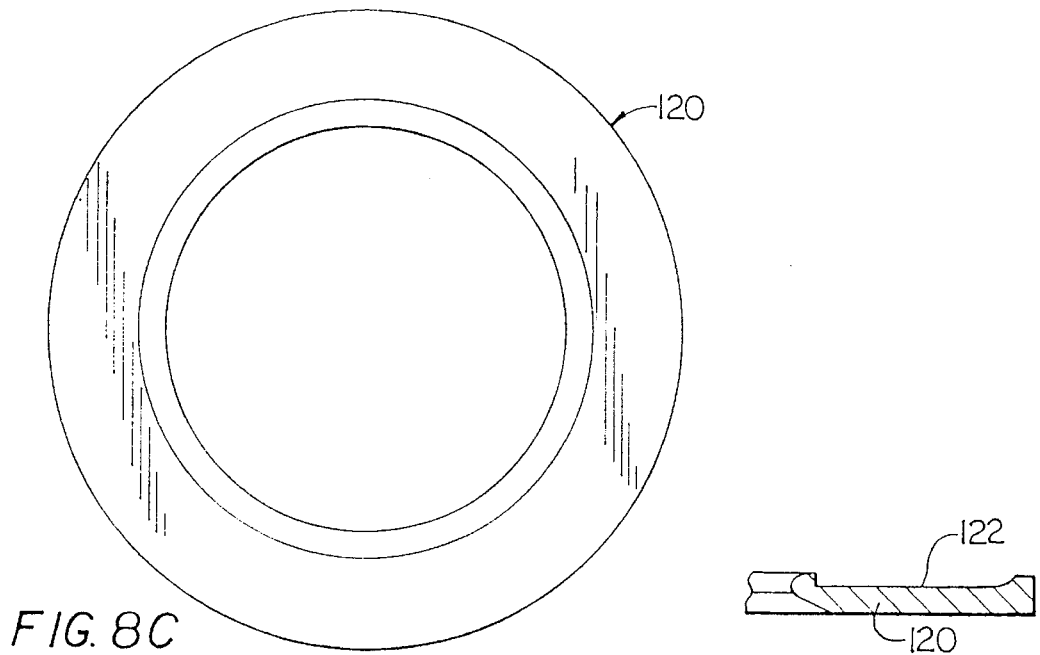
FIG. 8C is a bottom view of the upper deflector ring of FIG. 8A.
Figure 8D:
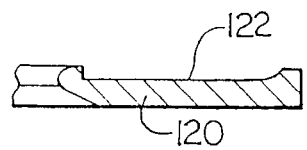
FIG. 8D is a detail of the upper deflector ring of FIG. 8B.

As shown in FIGS. 7C, 7D and 7E, the support structure 102 is typically solid from an upper surface thereof to a point where a lower ring 104 (discussed subsequently) extends radially inward. However, as shown in FIGS. 7D and 7F, the illustrated ring support structure 102 provides two ventilation passages 106 where a portion of the ring support structure 102 is hollow. As seen with respect to FIG. 7F, after installation of the support structure 102 within the liner 16, a gas such as air can flow down past the upper surface of the ring support structure 102, outward toward the liner 16 wall, and down past the outside edge of the lower ring 104. While the illustrated ring assembly 100 has two such ventilation passages 106, other numbers are possible, depending upon the requirements of the process(es) to be executed within the chamber 10.

Suspended from the ring support structure 102 at a lower end thereof is the lower ring 104. The illustrated lower ring 104 is integral with the ring support structure 102, and is contiguous with the support structure 102 except at the ventilation passages 106 where the support structure 102 is cut away; the lower ring 104 width remains constant. As shown especially in FIGS. 7E and 7F, upper edges of the lower ring 104 at the inner and outer diameters thereof are raised, thus forming a well 108 in which a pool of solvent is formed.

The inner diameter of the support structure 102 is narrowed approximately halfway down the inside of the support structure 102, thus forming a ledge 110. On this ledge 110, an upper ring 120 is installed, as shown in phantom in FIGS. 7E and 7F. In FIGS. 8A through 8D, the upper ring 120 is essentially a planar disk having a well 122 formed in an upper surface thereof, similar to the well 108 formed in the lower ring 104.

In an illustrative embodiment of the present invention, the ring assembly 100, including the lower and upper rings 104, 120, is formed of polypropylene or similar material.

Figure 9A:
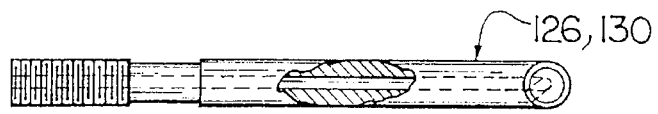
FIG. 9A is a top plan view of a rinse tube employed in the processing chambers of FIGS. 1A and 1B.
Figure 9B:
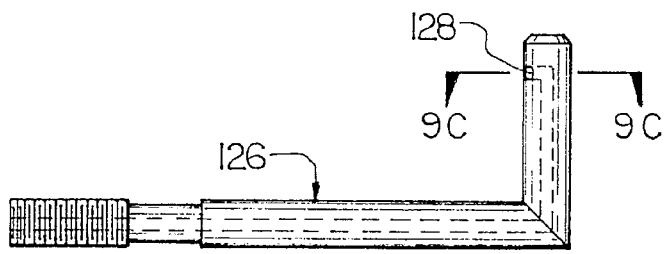
FIG. 9B is a side view of a lower ring rinse tube employed in the processing chambers of FIGS. 1A and 1B.
Figure 9C:
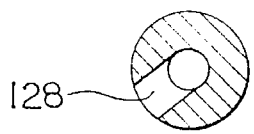
FIG. 9C is a top sectional view of the rinse tube of FIG. 9B taken along lines 9C—9C.

In order to provide a solvent-laden environment during substrate processing, it is necessary to provide the lower and upper ring wells 108, 122 with process chemicals, either periodically or continuously. The present invention relies on rinse tubes 126, 130 for this purpose. In FIGS. 9A and 9B, a lower rinse tube 126 is illustrated which interconnects with one of the conduit pair 79, 89 formed in one of the hubs 70, 80. The lower rinse tube 126 extends vertically through one of the ventilation passages 106, terminating between the lower and upper rings 104, 120. Near the upper end of the lower rinse tube 126, an outlet port 128 extends horizontally, offset approximately 37 degrees from the horizontal portion of the tube 126, such that a spray of process chemical is directed onto the lower ring well 108.

Figure 9D:
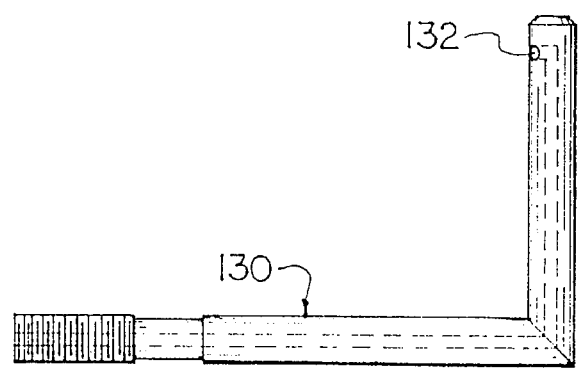
FIG. 9D is a side view of an upper ring rinse tube employed in the processing chambers of FIGS. 1A and 1B.

Similarly, an upper rinse tube 130, whose side view is shown in FIG. 9D, connects to the remaining one of the conduit pair 79, 89 formed in the hub 70, 80 and extends through the opposite ventilation passage 106, above the upper ring 120. The similarly offset outlet ports 132 thus provides a spray of process chemical into the upper ring well 122. With either rinse tube 126, 130, process chemical can be sprayed at pre-set intervals, at intervals determined dynamically, or continuously, depending upon the requirements of the particular subprocesses performed within the chamber 10.

In an illustrative embodiment, the rinse tubes 126, 130 are formed of quarter-inch stainless steel.

Figure 10A:
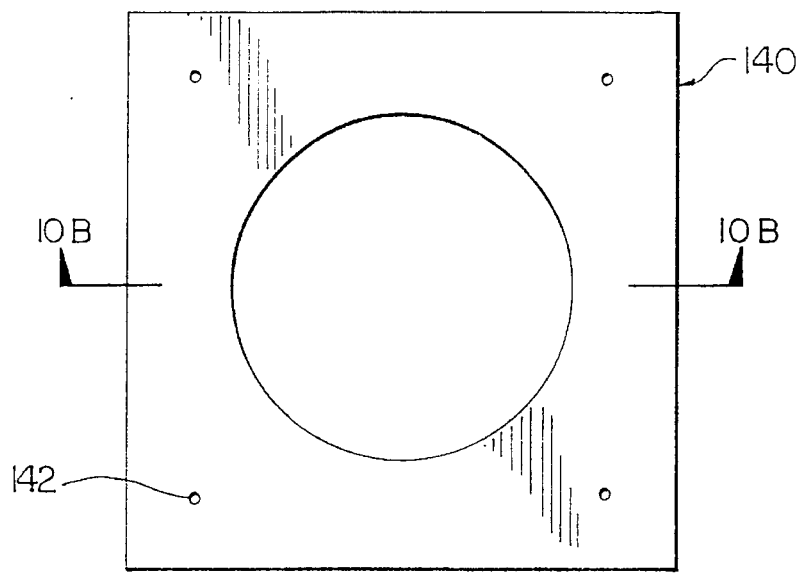
FIG. 10A is a top plan view of a coat subprocess deflector employed in the processing chambers of FIGS. 1A and 1B.
Figure 10B:
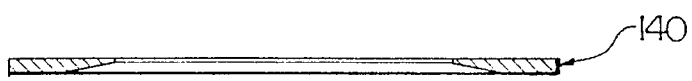
FIG. 10B is a side sectional view of the deflector of FIG. 10A taken along lines 10B—10B.
Figure 10C:
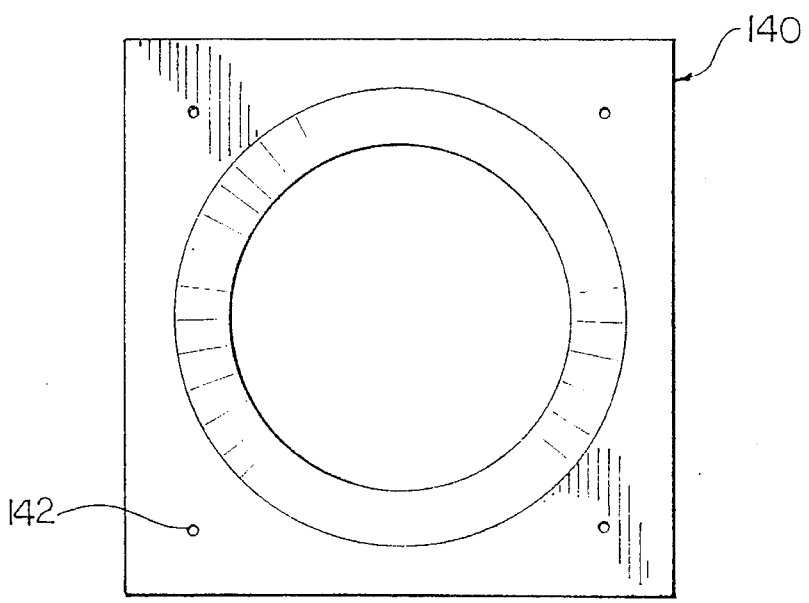
FIG. 10C is a bottom plan view of the deflector of FIG. 10A.
Figure 11A:
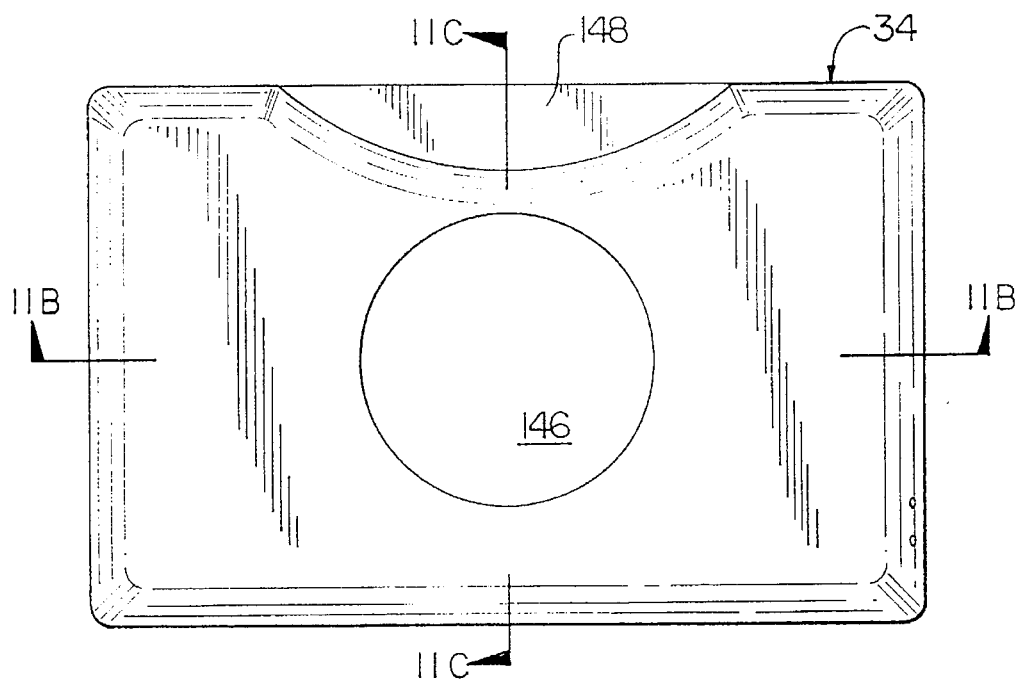
FIG. 11A is a plan view of a cover employed in the processing chambers of FIGS. 1A and 1B.
Figure 11B:
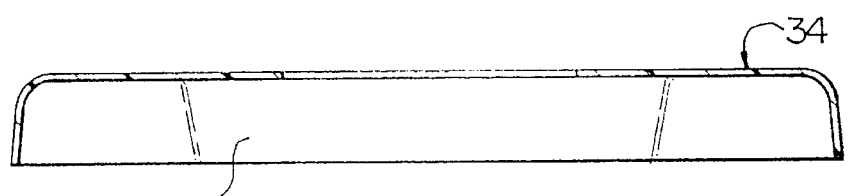
FIG. 11B is a side section view of the cover of FIG. 11A taken along lines 11B—11B.
Figure 11C:
FIG. 11C is a side section view of the cover of FIG. 11A taken along lines 11C—11C.
Figure 11D:
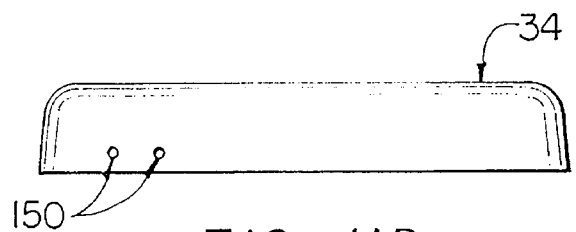
FIG. 11D is an end view of the cover of FIG. 11A.

A deflector 140, illustrated in FIGS. 10A through 10C, is disposed on top of the ring assembly 100 in order to channel exhaust air flow 12 and to prevent excess coating chemical from being deposited onto the upper ring 120. This deflector 140 is attached to the ring assembly 100 via fastening means such as threaded fasteners disposed through holes 142 formed through the deflector 140. The deflector 140 can be formed of a material such as quarter-inch polytetrafluoroethylene (PTFE) or polypropylene.

The cover 34 is disposed over the chamber 10 and all parts disposed therein, and is depicted in FIGS. 11A through 11D. Disposed within the cover 34 is an opening 146 which has a diameter allowing introduction of a substrate 24 into the chamber 10 and removal of a processed substrate 24 therefrom. In one embodiment, the cover 34 further provides a pinched region 148 which enables the use of a robotic substrate handling device (not shown) for substrate insertion and removal. Further, the cover is provided with mounting holes 150 for mounting a magnetic sensor (not shown) on the cover 34. This sensor enables the inhibition of the process when the cover 34 is not in place. The cover 34 is formed of 0.09 inch thick transparent polyethylene terephthalate (PET) plastic or translucent polypropylene in one embodiment.

While the present invention has been described as employing two vertically staggered rings 104, 120 within a chamber housing 14, it is understood that this invention can be modified to accept more than two vertically staggered rings. In such case, one or more additional liners 16 are provided having inner flanges 62 of different heights for elevating a hub 70, 80 to a proper height relative to the rings.

Further, while the cover 34 has been described and illustrated as having a pinched region 148 enabling robotic insertion and removal of substrates 24, the cover 34 used in the present invention can provided without a pinched region 148, either for manual substrate manipulation, or for use with an automatic substrate handling means which does not require the clearance afforded by the pinched region 148.

These and other examples of the concept of the invention illustrated above are intended by way of example and the actual scope of the invention is to be determined from the following claims.

What is claimed is:

1. A process chamber for a semiconductor or analogous substrate comprising:

a chamber housing having side walls and a bottom surface, the housing defining a cavity and the side walls having an upper rim; and a ring assembly disposed within said cavity, said ring assembly comprising a ring support structure proximate said chamber side walls, a lower ring disposed on said ring support structure and substantially parallel with said chamber bottom surface, an upper ring disposed on said ring support structure and substantially parallel with said lower ring, at least one ventilation passage defined by said ring support structure and adjacent said lower and upper rings, and a well formed on each of said lower and upper rings for retaining a quantity of process chemical.

2. The process chamber according to claim 1, said process chamber further comprising a liner interposed between said chamber housing and said ring assembly.

3. The process chamber according to claim 2, wherein said liner further comprises at least one liner drain disposed proximate said chamber housing bottom surface.

4. The process chamber according to claim 1, wherein said chamber housing further comprises at least one chamber drain formed in said chamber bottom surface.

5. The process chamber according to claim 1, said process chamber further comprising a cover disposed on said side wall upper rim.

6. The process chamber according to claim 5, wherein said cover defines a centrally located orifice substantially aligned with said cavity.

7. The process chamber according to claim 1, said process chamber further comprising a lower rinse tube and an upper rinse tube disposed proximate said lower and upper rings, respectively, for providing a quantity of process chemical to a respective ring well.

8. The process chamber according to claim 7, said process chamber further comprising a hub disposed through said housing bottom surface, said hub providing a fluid-tight connection for each of said lower and upper rinse tubes.

9. The process chamber according to claim 1, Said process chamber further comprising a substrate chuck disposed through said housing bottom surface and in mechanical communication with a motor disposed beneath said process chamber.

10. The process chamber according to claim 1, said process chamber further comprising a deflector ring disposed on an upper surface of said ring assembly, said deflector ring above and substantially parallel said upper ring.

11. A process chamber for applying photoresist and other process chemicals onto a substrate, said process chamber comprising:

a chamber housing having side walls and a bottom surface, said housing defining a cavity and said side walls having an upper rim;

a liner disposed within said cavity and adjacent said housing side walls and bottom surface; and a deflector ring assembly disposed within said cavity, said ring assembly comprising a ring support structure adjacent said housing side walls and said interposed liner, a lower deflector ring extending inwardly from said ring support structure, parallel to said housing bottom surface, and providing a first work position, an upper deflector ring extending inwardly from said ring support structure, parallel to said lower deflector ring, and providing a second work position, at least one ventilation passage defined by said ring support structure, adjacent said lower and upper rings, and a well formed in each of said lower and upper deflector rings for retention of a quantity of fluent process chemical.

12. The process chamber according to claim 11, said process chamber further comprising a cover disposed on said side wall upper rim, said cover having an orifice substantially aligned over said cavity.

13. The process chamber according to claim 11, wherein said bottom surface defines at least one cavity drain through said housing.

14. The process chamber according to claim 13, wherein said liner further comprises at least one liner drain in registration with said at least one cavity drain.

15. The process chamber according to claim 11, said process chamber further comprising a lower rinse tube and an upper rinse tube each disposed proximate a respective lower and upper ring for providing a quantity of process chemical to a respective ring well.

16. The process chamber according to claim 15, said process chamber further comprising a hub disposed through said housing bottom surface, said hub providing a fluid-tight connection for each of said lower and upper rinse tubes.

17. The process chamber according to claim 11, said process chamber further comprising a substrate chuck disposed through said housing bottom surface and in mechanical communication with a motor disposed beneath said process chamber.

18. The process chamber according to claim 11, said process chamber further comprising a deflector ring disposed on an upper edge of said ring assembly, said deflector ring above and substantially parallel said upper ring.

19. The process chamber according to claim 11, wherein said first work position comprises a substrate disposed above said upper and lower rings, whereby said substrate is exposed to a laminar gas flow substantially orthogonal to said substrate.

20. The process chamber according to claim 11, wherein said first work position is adapted for low impact application of a process chemical to said substrate.

21. The process chamber according to claim 11, wherein said second work position comprises a substrate disposed below said upper ring and above said lower ring, whereby a laminar exhaust gas flow through said cavity is channeled through said at least one ventilation passage in said deflector ring assembly to minimize the velocity of gas moving across said substrate.

22. The process chamber according to claim 11, wherein said second work position is adapted for a process chemical spinning-off process.

* * * * *